US007742746B2

(12) United States Patent
Xiang et al.

(10) Patent No.: US 7,742,746 B2
(45) Date of Patent: Jun. 22, 2010

(54) AUTOMATIC VOLUME AND DYNAMIC RANGE ADJUSTMENT FOR MOBILE AUDIO DEVICES

(75) Inventors: Pei Xiang, San Diego, CA (US); Song Wang, San Diego, CA (US); Prajakt V. Kulkarni, San Diego, CA (US); Samir Kumar Gupta, San Diego, CA (US); Eddie L. T. Choy, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 687 days.

(21) Appl. No.: 11/742,476

(22) Filed: Apr. 30, 2007

(65) Prior Publication Data

US 2008/0269926 A1    Oct. 30, 2008

(51) Int. Cl.
*H04B 1/00* (2006.01)
(52) U.S. Cl. ............... 455/63.1; 455/501; 455/63.13; 455/570; 455/114.2; 381/71.7; 381/94.3; 704/203
(58) Field of Classification Search ............... 455/63.1, 455/501, 63.13, 570, 114.2, 222, 277.2, 278.1, 455/296; 704/203, 211, 233; 381/71.7, 94.1, 381/71.1, 94.3
See application file for complete search history.

(56) References Cited

U.S. PATENT DOCUMENTS

| 4,251,688 | A | * | 2/1981 | Furner ........................... 381/18 |
| 4,641,344 | A | * | 2/1987 | Kasai et al. ..................... 381/57 |
| 5,319,736 | A | * | 6/1994 | Hunt ............................ 704/227 |
| 6,584,201 | B1 | | 6/2003 | Konstantinou et al. |
| 6,639,986 | B2 | * | 10/2003 | Kanamori et al. ........... 381/71.1 |

(Continued)

FOREIGN PATENT DOCUMENTS

| EP | 0661858 | 7/1995 |
| WO | 0059110 | 10/2000 |

OTHER PUBLICATIONS

Girolami, M., "Symmetric Adaptive Maximum Likelihood Estimation for Noise Cancellation and Signal Separation", Electronic Letters, 33(17): 1437-1438 (1997).

(Continued)

*Primary Examiner*—Minh D Dao
(74) *Attorney, Agent, or Firm*—Timothy F. Loomis; Espartaco Diaz Hidalgo

(57) ABSTRACT

A mobile audio device (for example, a cellular telephone, personal digital audio player, or MP3 player) performs Audio Dynamic Range Control (ADRC) and Automatic Volume Control (AVC) to increase the volume of sound emitted from a speaker of the mobile audio device so that faint passages of the audio will be more audible. This amplification of faint passages occurs without overly amplifying other louder passages, and without substantial distortion due to clipping. Multi-Microphone Active Noise Cancellation (MMANC) functionality is, for example, used to remove background noise from audio information picked up on microphones of the mobile audio device. The noise-canceled audio may then be communicated from the device. The MMANC functionality generates a noise reference signal as an intermediate signal. The intermediate signal is conditioned and then used as a reference by the AVC process. The gain applied during the AVC process is a function of the noise reference signal.

21 Claims, 6 Drawing Sheets

FUNCTIONAL DIAGRAM

U.S. PATENT DOCUMENTS

| | | | | |
|---|---|---|---|---|
| 6,675,125 | B2 * | 1/2004 | Bizjak | 702/179 |
| 6,766,176 | B1 | 7/2004 | Gupta et al. | |
| 7,023,984 | B1 | 4/2006 | Short et al. | |
| 7,027,981 | B2 * | 4/2006 | Bizjak | 704/225 |
| 7,190,292 | B2 * | 3/2007 | Bizjak | 341/139 |
| 7,206,420 | B2 * | 4/2007 | Bizjak | 381/106 |
| 7,558,391 | B2 * | 7/2009 | Bizjak | 381/106 |
| 2002/0051546 | A1 * | 5/2002 | Bizjak | 381/106 |
| 2002/0172376 | A1 * | 11/2002 | Bizjak | 381/94.3 |
| 2003/0055635 | A1 * | 3/2003 | Bizjak | 704/225 |
| 2005/0136848 | A1 * | 6/2005 | Murray | 455/79 |
| 2005/0141731 | A1 * | 6/2005 | Hamalainen | 381/94.3 |
| 2006/0133621 | A1 | 6/2006 | Chen et al. | |
| 2008/0027722 | A1 * | 1/2008 | Haulick et al. | 704/226 |
| 2010/0061566 | A1 * | 3/2010 | Moon et al. | 381/71.8 |

OTHER PUBLICATIONS

Torkkola, K., "Blind Separation of Convolved Sources Based on Information Maximization", Neural Networks for Signal Processing [1996] VI. Proceedings of the 1996 IEEE Signal Processing Society Workshop, Kyoto, Japan, pp. 423-432 (1996).

International Search Report—PCT/US08/061947. International Search Authority—European Patent Office, Aug. 14, 2008.

Written Opinion—PCT/US08/061947, International Search Authority—European Patent Office, Aug. 14, 2008.

* cited by examiner

MOBILE COMMUNICATION DEVICE

FUNCTIONAL DIAGRAM

OPERATION OF ADRC

AUTOMATIC VOLUME AND DYNAMIC RANGE ADJUSTMENT FOR MOBILE AUDIO DEVICES

BACKGROUND

1. Field

The disclosed embodiments relate to noise cancellation and automatic volume adjustment for mobile audio devices.

2. Background Information

FIG. 1 (Prior Art) is a diagram of an active noise cancellation system that removes noise and echoes from speech information. A first microphone MIC1, referred to as the speech reference microphone, is placed close to the desired speech source. It picks up acoustic speech information from the user of the cellular telephone and converts it into an electrical speech signal 1. This speech signal 1 is contaminated with background noise. A second microphone MC2, referred to as the noise reference microphone, is placed close to the noise sources or far away from the speech source. It picks up acoustic noise, and converts it into an electrical noise reference signal 2. The noise reference signal 2 is assumed to be relatively free of the desired speech information as compared to the speech signal. Separation circuitry 3 uses the noise reference signal to cancel noise and to separate incoming signals into a speech signal 4 and a noise signal 5. The speech signal 4 is relatively free of noise. Echo cancellation involves employing adaptive filters to mimic echo paths. Cancellers 6 and 7 subtract the generated echo signals from the signals output by microphones MIC1 and MIC2. There are many such active noise cancellation techniques and circuits that are practiced in various technical fields.

Mobile communication devices (for example, cellular telephones) generally have small physical dimensions. These small dimensions limit the distance between the multiple microphones of an active noise cancellation system. As a consequence, the noise reference signal is generally not free of the desired speech information and noise cancellation performance is limited. Simple active noise filtering techniques tend to cancel some of the desired speech signal while leaving some of the noise uncancelled.

A more sophisticated noise reduction technique known as Blind Source Separation (BSS) has been used in digital hearing-aids. In such a BSS system, two microphones of a noise cancellation system are located in the ears of the hearing aid user. Accordingly, neither one of the two microphones can be used primarily for picking up noise. Both microphones pick up speech as well as noise to be cancelled. A temporal anti-Habbian learning algorithm is used to separate noise and speech information. For further information, see "Symmetric Adaptive Maximum Likelihood Estimation For Noise Cancellation And Signal Separation", Electronics Letters, 33(17): 1437-1438 (1997), by M. Girolami; and "Blind Separation Of Convolved Sources Based On Information Maximization", IEEE Workshop On Neural Networks for Signal Processing, Kyoto, Japan (1996), by K. Torkkola. Because performance of the BSS system generally relies on impulse response symmetry and proper placement of the microphones, additional signal processing may be applied.

FIG. 2 (Prior Art) is a diagram of a system employed in some cellular telephones. When using a cellular telephone, a cellular telephone user may be listening to audio that has softer passages as well as other relatively louder passages. If the user is listening to the audio in a noisy environment, then background noise may prevent the user from hearing the softer passages. If the overall electrical signal being supplied to the speaker were simply amplified, then the softer passages would be amplified so that the user could hear the softer passages, but the louder passages may then be amplified to the point that clipping occurs. Such clipping would introduce undesirable distortion into the sound emitted from the speaker. The loud sound could also damage the ear of the user. To prevent such undesirable clipping and distortion, the amplitude of signal 8 is tracked in the time domain. The signal is amplified by a gain that is a function of the input amplitude such that if the signal is weaker then the signal is amplified by larger gain values whereas if the signal is stronger then the signal is amplified by smaller gain values. The dynamic range of the overall signal is therefore compressed. This process may be referred to as "compression" or "Audio Dynamic Range Control" (ADRC) and occurs in ADRC block 10.

A process known as Automatic Volume Control (AVC) 11 is then applied to the output of ADRC block 10. The level of background noise is detected by microphone 12 and related circuitry 13. Under low background noise conditions, the compressed signal 9 need not be amplified by AVC block 11 and is supplied to the speaker largely unamplified. Under high background noise conditions, however, compressed signal 9 is substantially amplified by AVC block 11. Due to the compression performed by ADRC block 10, clipping of the high amplitude portions of the audio is reduced or eliminated. The above description of FIG. 2 is a simplification. See U.S. Pat. No. 6,766,176 for a more detailed description.

SUMMARY INFORMATION

A mobile audio device (for example, a mobile communication device such as a cellular telephone) performs Audio Dynamic Range Control (ADRC) to limit the dynamic range of an audio signal. Automatic Volume Control (AVC) then applies a gain to boost the amplitude of the signal output from the ADRC. This amplification occurs without introducing substantial distortion due to clipping. The resulting compressed audio signal is used to drive a speaker of the mobile audio device. The compressed audio signal actually typically drives the speaker indirectly through intervening circuitry such as an digital-to-analog converter as is conventional.

The mobile audio device also performs Multi-Microphone Active Noise Cancellation (MMANC). In one example, MMANC is used to remove background noise from non-noise audio information (for example, speech information) picked up on microphones of the mobile audio device. The non-noise information (for example, speech information) is forwarded to an air interface for transmission from the mobile audio device. In performing the active noise cancellation operation, the MMANC process generates a noise reference signal as an intermediate signal.

An environment in which the mobile audio device is operating may involve stationary noise that has a relatively constant characteristic, and/or may also involve non-stationary noise that changes more rapidly. If, for example, a user of the mobile audio device is in a crowded room, then a background conversation may introduce such non-stationary noise. If, for example, the user is walking along a busy street, then a vehicle passing in the street may introduce such non-stationary noise. In one example of the MMANC process, the noise reference signal that is generated by the MMANC process is adjusted relatively rapidly to indicate the presence or absence of such non-stationary noise. The noise reference signal is adjusted at the approximate rate that incoming microphone audio samples are received into the MMANC process. The active noise cancellation process is such that the noise reference signal properly indicates the presence or absence of noise even when the user of the mobile audio device is speaking and the user's speech is being picked up by the microphones.

In one advantageous aspect, the noise reference signal that is the intermediate signal generated in the MMANC process is used to control the ADRC and AVC process. In one example, the noise reference signal is scaled and filtered to generate a control signal. The control signal is a reference that the AVC portion of the ADRC and AVC process uses to determine the gain that the AVC portion applies to the output of the ADRC portion. The gain applied is a function of the control signal.

The mobile audio device may, for example, be a digital audio player (such as an MP3 player), a digital media player (for example, an iPOD that has image and video playing capabilities), a digital camera, a personal digital assistant (PDA), a portable personal computer such as a laptop computer, or a mobile communication device (such as a cellular telephone), or other similar device that can play audio. The mobile audio device may or may not include a capacity to capture, store and/or transmit audio information picked up on the microphones.

Additional methods and structures are described in the detailed description below. This summary does not purport to define the invention. The invention is defined by the claims.

DETAILED DESCRIPTION

Figure 3:
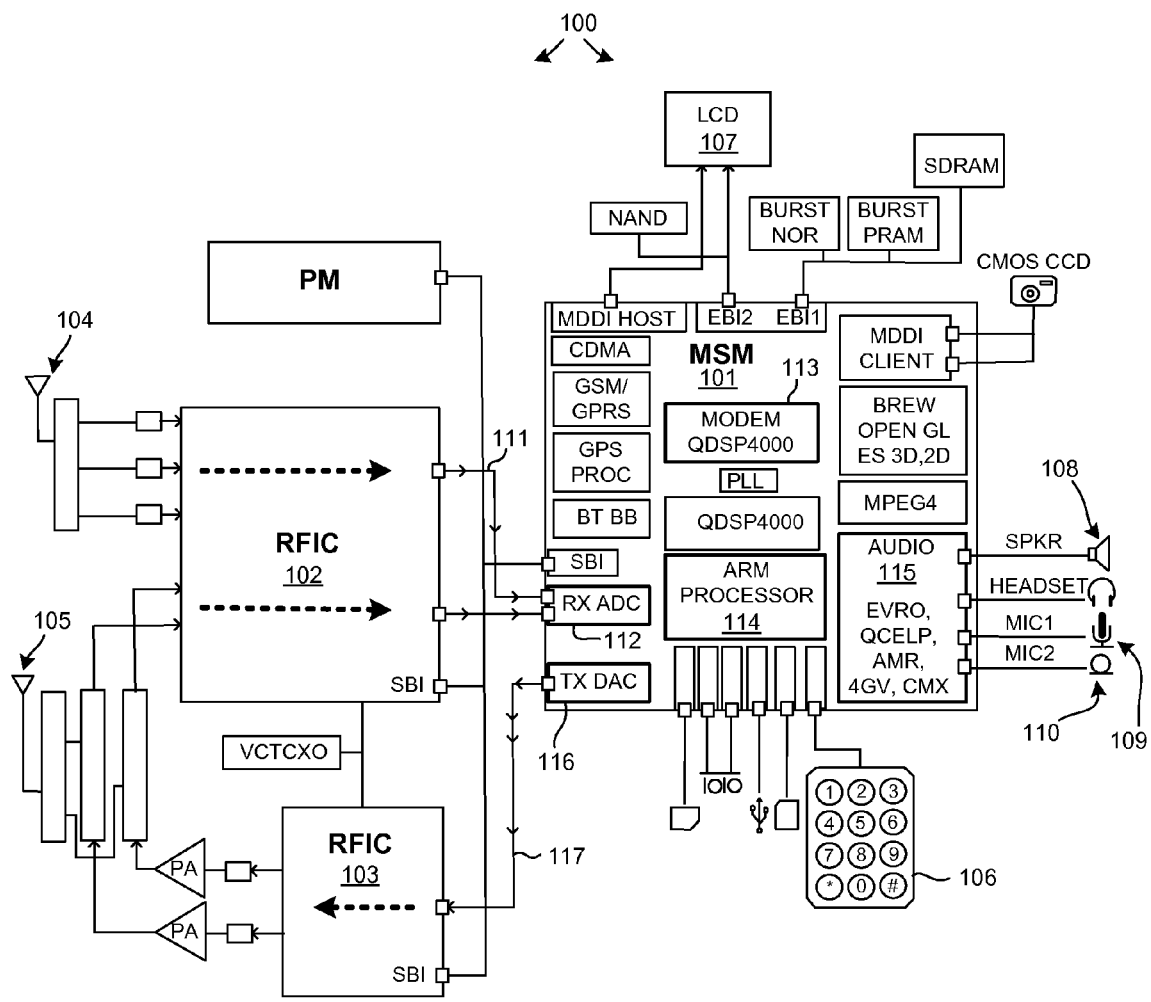
FIG. 3 is a high level block diagram of one specific type of mobile audio device 100 in accordance with one novel aspect.

FIG. 3 is a block diagram of one specific example of a mobile audio device 100 in accordance with one novel aspect. Mobile audio device 100 in this example is a mobile communication device, and more particularly is a cellular telephone. Mobile audio device 100 includes a digital baseband integrated circuit 101 (referred to here as the "mobile station modem" or MSM), a first radio frequency (RF) transceiver integrated circuit 102, a second RF integrated circuit 103, a first antenna 104, a second antenna 105, and a set of other discrete components that couple the antennas to the RF integrated circuits. In addition, mobile audio device 100 includes other components such a keypad 106, a display 107, a speaker 108, and a first microphone 109 and a second microphone 110.

The general path of telephone conversation information received onto mobile audio device 100 from antenna 105 passes through first RF integrated circuit 102, across path 111, and into a receive analog-to-digital converter (RX ADC) 112 of MSM 101. If the information is speech information that is to be heard on the speaker 108, then the information is processed by digital circuitry on MSM 101 such as the modem block 113 the processor 114 into a stream of speech-coded digital values. The stream of speech-coded digital values is decoded by an appropriate vocoder in audio block 115, and is converted into an analog signal that is then output to drive speaker 108. If speech of the telephone conversation is to be picked up by a microphone of mobile audio device 100 for transmission over antenna 105 to another participant of the telephone conversation, then the path of the information extends from microphones 109 and 110, and into audio block 115. The information is converted into digital form, and the appropriate vocoder in audio block 115 encodes the information into a stream of coded digital values. After processing by processor 114 and modem block 113, the transmitter digital-to-analog converter (TX DAC) 116 outputs the information in analog form via path 117 to second RF integrated circuit 103. The information passes through second RF integrated circuit 103, through discrete power amplifiers and other circuitry, and to antenna 105 for transmission.

Figure 4:
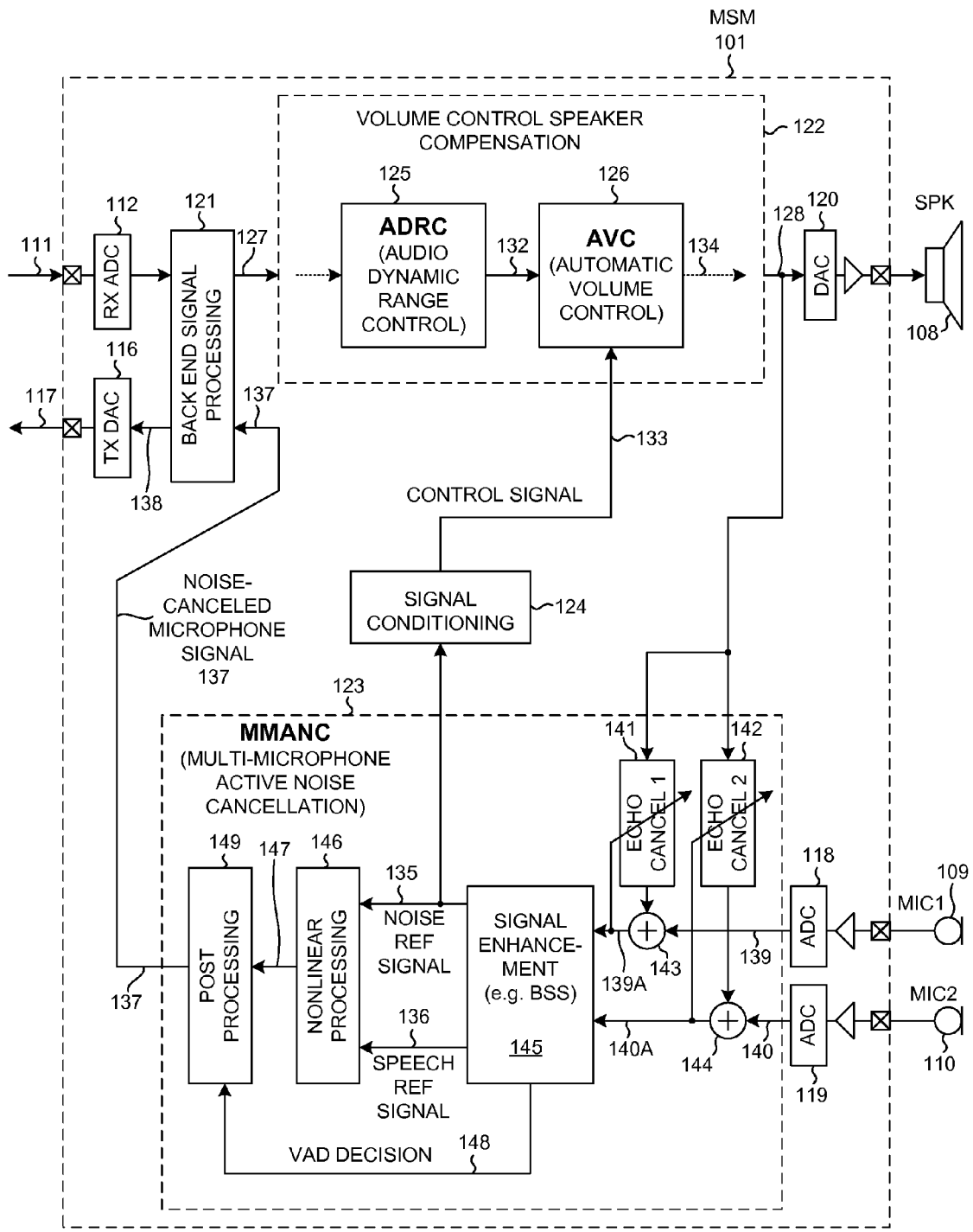
FIG. 4 is a functional block diagram that illustrates functions performed in the MSM integrated circuit 101 of FIG. 3.

FIG. 4 is a functional block diagram that illustrates functions performed in the MSM integrated circuit 101 of FIG. 3. Two analog-to-digital converters (ADC) 118 and 119 are provided in audio block 115 of FIG. 3. ADC 118 digitizes an analog signal received from first microphone 109 whereas ADC 119 digitizes an analog signal received from second microphone 110. A digital-to-analog converter (DAC) 120 is provided in audio block 115 of FIG. 3. The analog signal output by DAC 120 drives speaker 108 as illustrated. The diagram of FIG. 4 illustrates four main mechanisms or functional blocks: 1) a back end signal processing function block 121, 2) a volume control and speaker compensation functional block 122, 3) a Multi-Microphone Active Noise Cancellation (MMANC) functional block 123, and 4) a signal conditioning functional block 124. Functional block 122 may also be referred to as a "speaker gain control unit." The audio signal path to speaker 108 through blocks 122 and 120 is sometimes referred to as the "forward link". The audio signal path from microphones 109 and 110 through blocks 118, 119 and 123 is sometimes referred to as the "reverse link". Each of the mechanisms or functional blocks 121, 122, 123 and 124 may be realized in software, in firmware, in dedicated hardware, or combinations thereof. In one example, the functional blocks 121, 122 and 123 of FIG. 4 are realized as sets of processor-executable instructions executing on one or more processors in integrated circuit 101. The sets of processor-executable instructions are stored in one or more associated processor-readable media (for example, ROMs or other semiconductor memories) in integrated circuit 101.

The volume control and speaker compensation functional block 122 of FIG. 4 performs Audio Dynamic Range Control (ADRC) and Automatic Volume Control (AVC) functions. Accordingly, block 122 includes an ADRC functional block 125 as well as an AVC functional block 126.

Figure 5:
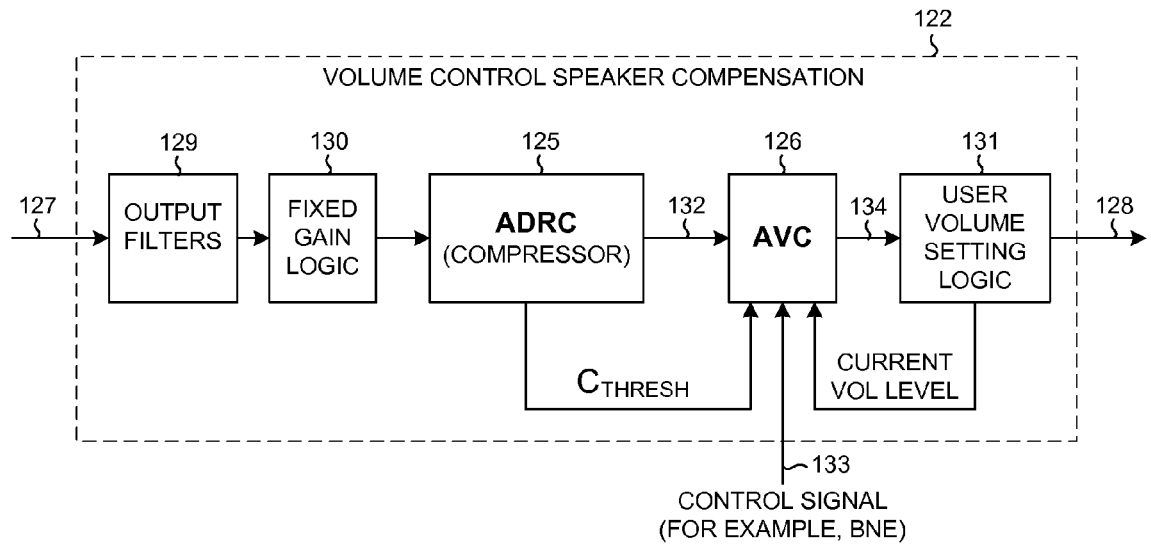
FIG. 5 is a block diagram of one example of the volume control and speaker compensation functional block 122 of FIG. 4.

FIG. 5 shows one specific example of the volume control and speaker compensation functional block 122 in further detail. Arrow 127 represents a stream of digital pulse code modulated (PCM) audio information values that passes from back end signal processing functional block 121 of FIG. 4 into the volume control and speaker compensation functional block 122 of FIG. 4. Arrow 128 represents a stream of compressed digital audio information values that passes from the volume control and speaker compensation functional block 122 of FIG. 4 to DAC 120 of FIG. 4. As illustrated in FIG. 5, volume control and speaker compensation functional block 122 includes output filters 129, fixed gain logic 130, ADRC (sometimes referred to as a "Compressor") 125, AVC 126, and user volume setting logic 131.

ADRC and AVC:

Mobile audio device 100 is usable in an environment having a high level of background noise that includes stationary noise and non-stationary noise. Consider a situation in which a user of mobile audio device 100 is listening to sound emitted from speaker 108. A first passage of the sound may be relatively soft because the corresponding passage of values in the stream of digital audio information values 127 has relatively small amplitudes. A second passage of the sound may be relatively loud because the corresponding passage of values in the stream of digital audio information values 127 has a relatively large amplitudes. (The term "passage" here denotes a time slice of audio or its corresponding portion of a stream of audio information values, where the passage is taken in the temporal domain so that one of the passages occurs before the other in time.) If dynamic range control were not performed and if both passages of stream 127 were simply converted into analog form and used to drive speaker 108, then the user may have difficulty hearing the corresponding soft passage of audio due to the high background noise. If, on the other hand, both passages were amplified by the same gain value such that the lower amplitude passage could be heard more easily, then the relatively higher amplitude passage may be amplified so much that clipping occurs. Such clipping is generally undesirable because it introduces distortion into the sound as emitted from speaker 108.

There are multiple different variants of ADRC and AVC functions that are usable in different embodiments of volume control speaker compensation block 122 of FIG. 4. In accordance with a first specific example, the digital values of stream 127 are filtered and multiplied by a fixed gain. ADRC 125 tracks the amplitude level of the stream as it is received into block 125. ADRC 125 multiplies the digital values of the stream by a gain value that is a function of the amplitude (determined over multiple digital values) of the incoming stream.

Figure 6:
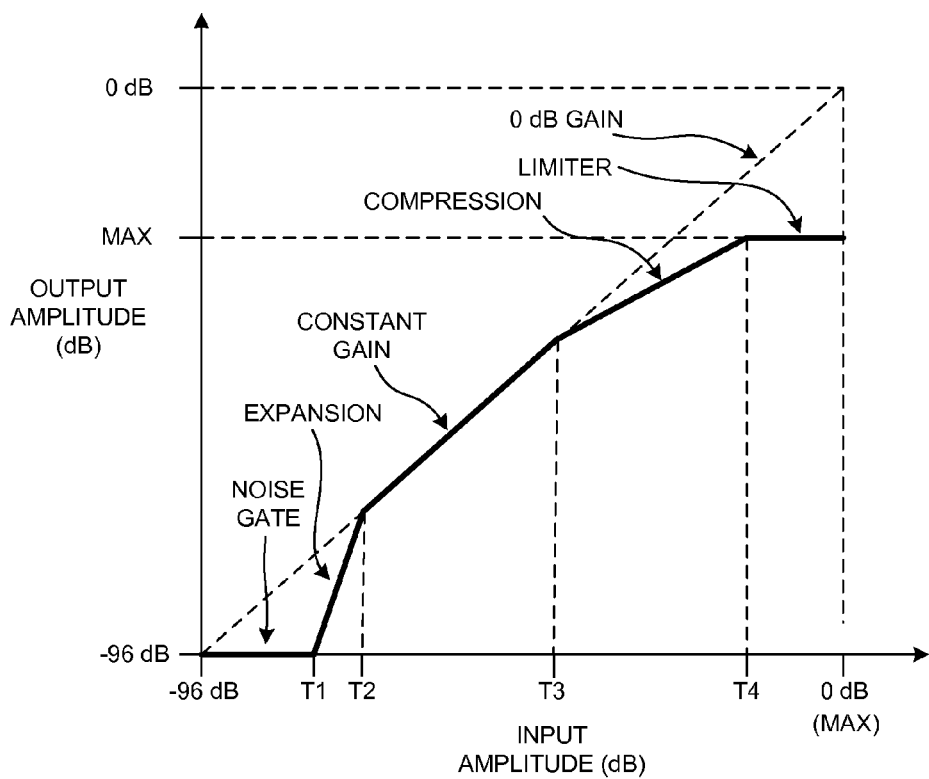
FIG. 6 is a graph that illustrates an operation of ADRC functional block 125 of FIG. 5.

FIG. 6 is a diagram that illustrates operation of ADRC 125. In the present example, if the incoming amplitude is determined to be below a first predetermined threshold T1, then a gain of zero is applied. This is sometimes referred to as a "noise gate". Preferably speaker 108 outputs no sound in such a situation. If, however, the incoming amplitude is between the first predetermined threshold T1 and a second predetermined threshold T2, then ever increasing gains are applied as the operating point moves to the right from threshold T1 along the upwardly extending dark line in the graph of FIG. 6. This region of operation of ADRC 125 is sometimes referred to as "expansion". If, the incoming amplitude is between the second predetermined threshold T2 and a third predetermined threshold T3, then a constant gain is applied. This constant gain is indicated by the slope of inclined dashed line in FIG. 6. If the amplitude of the incoming signal is above third threshold T3, then ever decreasing gains are applied as the operating point moves the right from threshold T3 along the dark line. This region of operation of ADRC 125 is sometimes referred to as "compression". If the amplitude of the incoming signal is above a fourth threshold T4, then the output is "limited" to a MAX value. Accordingly, low amplitude passages of the incoming signal below T3 are amplified with higher gain values than the high amplitude portions of the incoming signal above T3. The dynamic range of the overall audio information of signal 127 is said to be "compressed" by ADRC 125. The resulting gain-adjusted components values constitute stream 132 of compressed digital audio information values.

Automatic Volume Control (AVC) 126 then applies a gain to stream 132, thereby generating stream 134 of volume-controlled digital values. As a consequence of ADRC 125 having previously limited the dynamic range of the audio stream, when AVC functional block 126 amplifies the values in the stream by the gain, softer passages of the audio can be heard more easily by the user from speaker 108, yet louder passages of the audio are not amplified so much that substantial clipping occurs. Distortion in the sound due to clipping is reduced or prevented.

In one example of functional block 122, stream 127 is separated into a plurality of frequency bands. Each frequency band undergoes separate ADRC and AVC processing. The various parameters of the compression operation (the gain values applied and the predetermined amplitude thresholds) can be set to be different for the different frequency bands. Rather than there being one control signal 133, signal conditioning block 124 generates a control signal for each frequency band. The control signal for a band is used as a reference for the AVC processing of the band. After ADRC and AVC processing of each band, the output streams of the AVC processes of all the bands are combined to form single stream 128 of compressed digital audio information. This stream 128 passes through user volume setting logic, is converted into analog form, and is supplied to a speaker. Some music has a strong bass drum kick beat that is relatively low in frequency. By separating energy of this bass drum kick beat into its own frequency band, gain and threshold values can be applied to this frequency band that tend to amplify the bass drum kick beat component of the music less than the other components of the music.

A second specific example of the ADRC and AVC functional blocks of FIG. 4 is set forth in U.S. Pat. No. 6,766,176, and in particular the discussion of the upper part of FIG. 8 of U.S. Pat. No. 6,766,176. FIG. 5 is a more detailed diagram of the volume control speaker compensation functional block 122 in this second specific example. As explained in U.S. Pat. No. 6,766,176, output filters 129 provide digital values to fixed gain logic 130, which in turn multiplies the digital values by a fixed gain G, thereby producing amplified digital sample values. The amplified digital sample values are provided to ADRC functional block 125. ADRC functional block 125 performs compression and generates the stream 132 of compressed digital audio information values. AVC 126 receives a periodically updated background noise estimate (BNE) control signal 133. AVC 126 multiplies the digital values in stream 132 by a gain value based upon an assessment of available headroom (as obtained from Cthresh received from ADRC 125 and as obtained from a current volume level signal received from block 131) and the BNE control signal 133. AVC 126 outputs stream 134 of volume-controlled digital values that is supplied to the user volume setting logic 131. The user of mobile audio device 100 may manually set a speaker volume level using user volume setting logic 131 such that AVC 126 thereafter controls speaker volume to have the user-desired speaker volume level as a target volume. Accordingly, user volume setting logic 131 provides stream 128 of digitized speech samples, at the appropriate volume level, to DAC 120. DAC 120 in turn converts stream 128 into an analog signal that is used to drive speaker 108.

Figure 7:
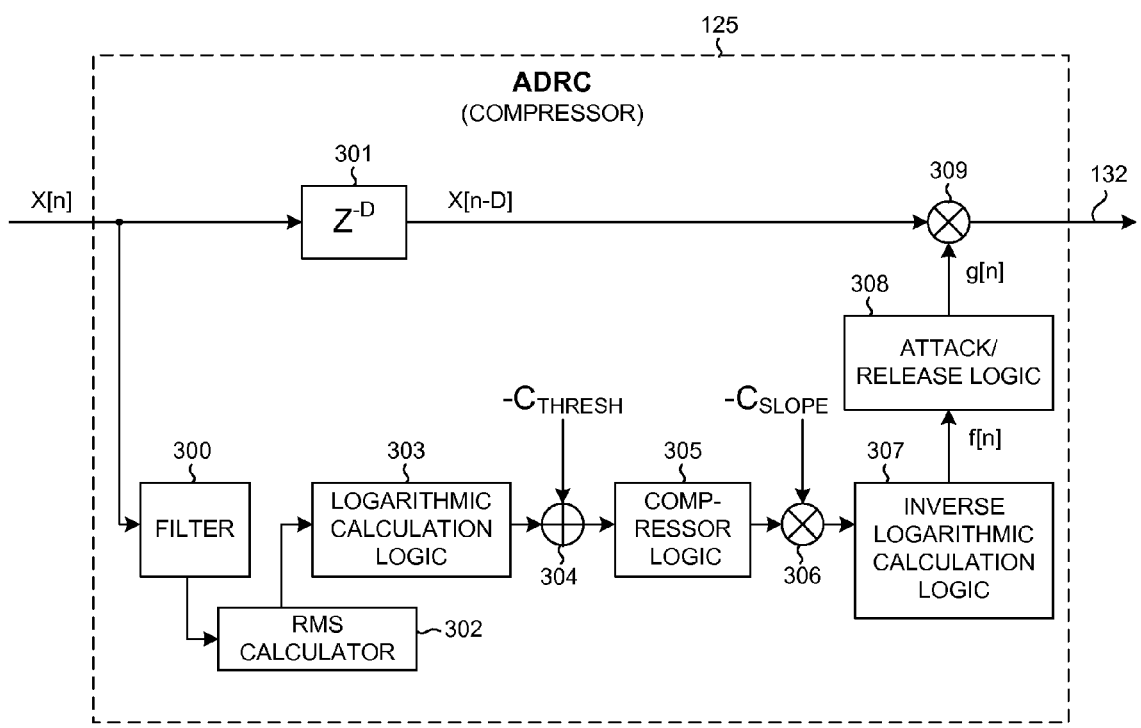
FIG. 7 is a more detailed functional block diagram of ADRC functional block 125 of FIG. 5.

FIG. 7 is a more detailed functional block diagram of ADRC functional block 125 of FIG. 5. See U.S. Pat. No. 6,766,176 for further details. Digital value samples x[n], after amplification by fixed gain logic 130, are provided to filter 300 (filter 300 is optional and may be omitted in certain embodiments) and to delay element 301. Delay element 301, which may be implemented as a FIFO, serves to control the output signal level predictively, thereby attacking peaks ahead of transmission. Filter 300 may be a bandpass filter. RMS calculator 302 determines an RMS (root mean square) level of the samples. RMS calculator 302 in one embodiment is a first order low-pass filter applied to the stream digital value samples. The time constant of the filter is chosen so that the smallest frequency component of interest can achieve a constant RMS output for the given smoothing filter. The RMS level value is supplied to logarithmic calculation logic 303, which calculates the base-2 logarithm of the RMS level value and multiplies the calculated base-2 logarithm value by 0.5, thereby generating an output signal in units of decibels (dB). The dB signal is supplied to adder/subtractor 304, which subtracts a compression threshold value Cthresh from the dB signal. A resultant dB signal is provided to compressor logic 305, which performs a compression function on the signal. The resultant signal is provided to multiplier 306, which multiplies the signal by an attenuating (negative) compression slope value Cslope. If the RMS level rises above the value Cthresh, then compression is applied to the signal (with appropriate attack and release times) based upon the value Cslope, which specifies a compressor ratio R as a ratio of dB in accordance with the following equation: Cslope=1−1/R. The compression ratio R may be defined as the RMS level above which all compression actually occurs. The compression threshold value Cthresh and the compression slope value Cslope for a particular signal path should be chosen in accordance with the average dBm0 talker level desired for normalization. Multiplier 306 provides an output dB signal to inverse logarithmic calculation logic 307, which calculates the inverse base-2 logarithm of the dB signal by raising the value two to the exponential power of the dB signal value (G, in dB). Inverse logarithmic calculation logic 307 generates output signal f[n]. Signal f[n] is provided to attack/release time application logic 308, which generates signal g[n] in accordance with the Equation 1 below:

$$g[n]=(1-k)g[n-1]+kf[n] \quad \text{(Equ. 1)}$$

where the value k is a smoothing coefficient.

Attack release time application logic 308 applies a first-order smoothing function to provide a smooth gain curve for application to the output signal (the value k is changed depending upon whether attack or release is being applied). The attack time may be set to one millisecond to attack peaks in the input samples quickly and accurately. The release time may be set to between 100 and 200 milliseconds to keep quick gain fluctuations from affecting the quality of compression. Smoothed signal g[n] is provided to second multiplier 309. Delay element 301 delays the digital sample values x[n] by time D, generating delayed output digital sample values x[n-D]. The delayed digital sample values x[n-D] are provided to second multiplier 309. Second multiplier 309 multiplies the delayed samples x[n-D] by the smoothing function g[n], thereby generating the stream 132 of compressed digital audio information values.

MMANC:

There are multiple different ways of performing Multi-Microphone Active Noise Cancellation (MMANC) that are suitable for use in mobile audio device 100 of FIG. 3. FIG. 4 illustrates one specific example. In FIG. 4, MMANC functional block 123 receives signals from two microphones 109 and 110, and performs echo canceling and signal enhancement to generate a noise reference signal 135 and a speech reference signal 136. Subsequent processing generates the noise-canceled microphone signal 137 that is largely free of background noise. Signal 137 is a stream of digital values. Signal 137 is supplied to back end signal processing functional block 121. An appropriate vocoder in functional block 121 speech-encodes the digital values into a corresponding stream of speech-coded values. After processing by modem 113 and processor 114 of Figure, the stream of speech coded values 138 is converted by TX DAC 116 into an analog signal. The analog signal is communicated across path 117 to RF integrated circuit 103 for transmission from antenna 105.

In the specific example of MMANC functional block 123 of FIG. 4, the analog output signal from microphone 109 is digitized by analog-to-digital converter 118 into a resulting stream 139 of digitized speech sample values. Similarly, the analog output signal from microphone 110 is digitized by analog-to-digital converter 119 into a stream 140 of digitized speech sample values. Echo canceller 1 functional block 141 and echo canceller 2 functional block 142 are adaptive digital filters that generate signals that mimic echoes in streams 139 and 140. Subtractor 143 subtracts the synthesized echo signal from stream 139. The resulting echo-canceled stream 139A of digital values is supplied to Blind Source Separation (BSS) Signal Enhancement functional block 145. Similarly, subtractor 144 subtracts the synthesized echo signal from stream 140. The resulting echo-canceled stream 140A of digital values is supplied to Blind Source Separation (BSS) Signal Enhancement functional block 145. The Blind Source Separation operation, which is also sometimes referred to in the art as independent component analysis (ICA), uses a temporal anti-Habbian learning algorithm to generate the noise reference signal 135 and the speech reference signal 136. For additional information see: "Symmetric Adaptive Maximum Likelihood Estimation For Noise Cancellation And Signal Separation", Electronics Letters, 33(17): 1437-1438 (1997), by M. Girolami; and "Blind Separation Of Convolved Sources Based On Information Maximization", IEEE Workshop On Neural Networks for Signal Processing, Kyoto, Japan (1996), by K. Torkkola.

Non-linear processing functional block 146 first breaks the speech reference signal 136 and the noise reference signal 135 up in the frequency domain to obtain multiple different spectral components (different bands) of each reference signal. For each band, a variable gain is calculated. In one example, the variable gain is given by the equation (S−N)/S, where S is the magnitude of the speech reference signal 136 in the band, and where N is the magnitude of the noise reference signal 135 in the band. The speech reference signal 136 bands do contain some noise. The variable gain is applied to further reduce this noise in each band of the speech reference signal. After the variable gain has been applied to each separate band of the speech reference signal, the resulting bands are combined back into a single time domain signal 147.

The speech reference signal 136 typically contains periods having speech information and also contains other periods of relative pauses (for example, non-speech pauses between words in a sentence). A Voice Activity Detect (VAD) decision signal 148 indicates whether there is speech in signal 136 or whether there is a pause in signal 136. The VAD decision signal 148 is based on information collected over a frame of consecutive digital values. In one example, a frame is eighty digital values of the echo-canceled signals, and the VAD signal 148 is a single bit value. The VAD decision is updated once each frame. Post processing functional block 149 uses the VAD decision signal 148. If the VAD decision signal indicates that there is speech, then post processing functional block 149 applies a first gain value (for example, a gain of one), whereas if the VAD decision signal indicates there is a pause, then post processing functional block 149 applies a second gain value (for example, a gain of 0.5). The resulting signal as output from the post processing functional block 149 is noise-canceled microphone signal 137.

In the specific example of FIG. 3, the mobile audio device 100 is a cellular telephone. The non-noise audio information picked up on microphones 109 and 110 is therefore referred to as "speech" information. Signal 136 in FIG. 4 is therefore referred to a "speech reference signal." It is to be understood, however, that the mobile audio device 100 need not be a cellular telephone. If, for example, the mobile audio device 100 is a digital audio player such as an MP3 player, then intermediate signal 136 generated by MMANC 123 is more generally referred to as an "audio reference signal". In the case of a digital audio player, MMANC 123 may not output a noise-canceled microphone signal 137 because the digital audio player may not capture audio information for recording and storage purposes.

Figure 1:
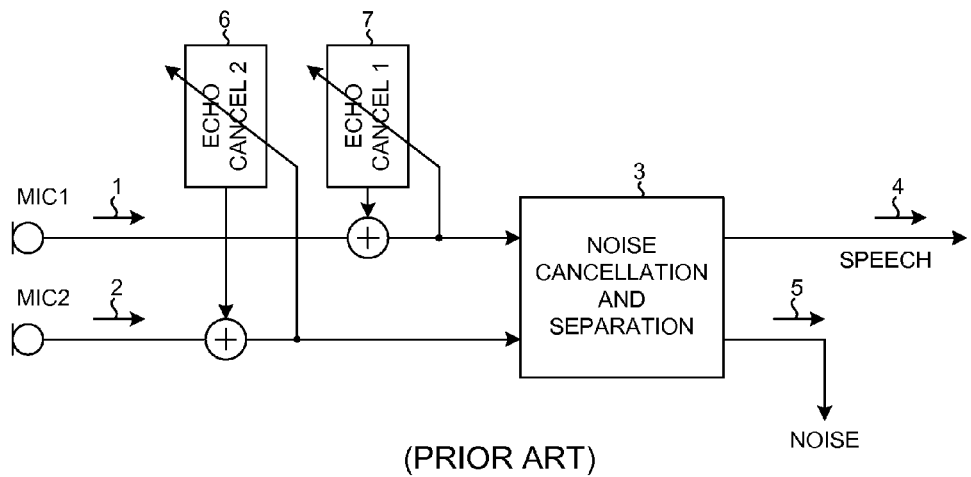
FIG. 1 (Prior Art) is a diagram of a multi-microphone active noise cancellation system.
Figure 2:
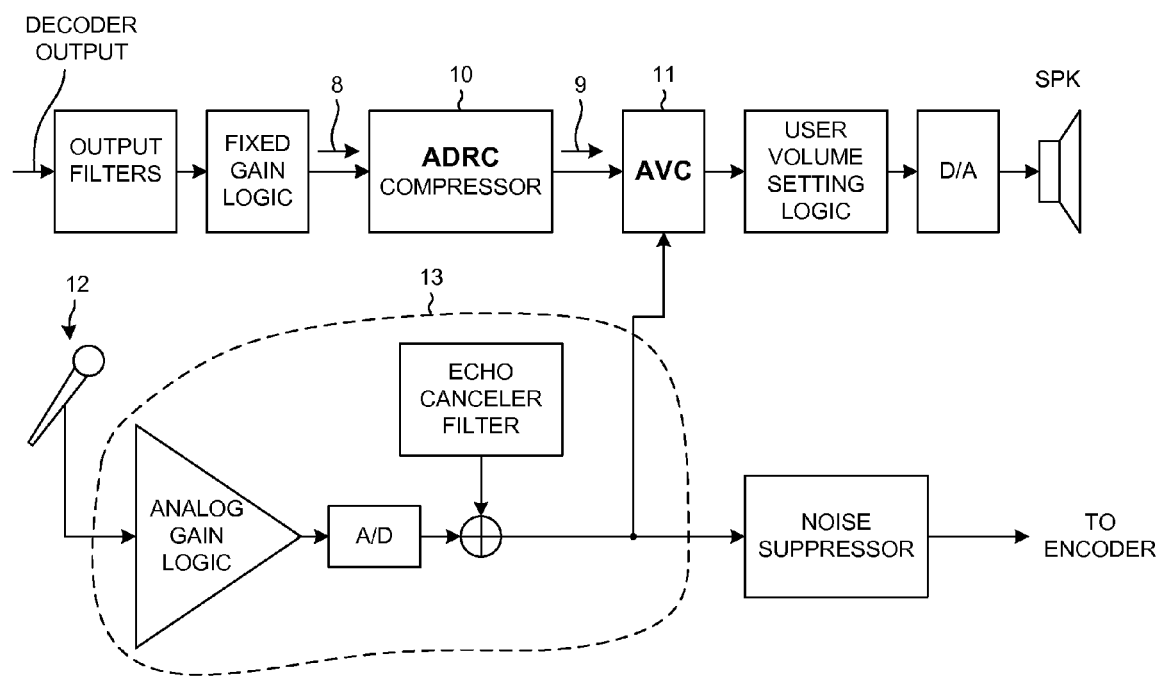
FIG. 2 (Prior Art) is a diagram of a system employed in some cellular telephones that involves Audio Dynamic Range Control (ADRC) and Automatic Volume Control (AVC).

Control of ADRC and AVC:

In accordance with one novel aspect, the gain applied by the Automatic Volume Control AVC 126 of FIG. 4 is a function of noise reference signal 135 that is generated as an intermediate signal by MMANC functional block 123. It is recognized that many cellular telephones employ fairly sophisticated multi-microphone active noise cancellation techniques. Application of these techniques results in a separation of microphone pickup signals into speech reference signals and noise reference signals. Rather than using the level of background noise as detected by circuitry 13 in the conventional circuit of FIG. 2 to control the gain of the AVC function, a noise reference signal generated by a Multi-Microphone Active Noise Cancellation functionality is used to control the gain of the AVC function. In the specific example of FIG. 4, signal conditioning functional block 124 receives noise reference signal 135 and performs scaling and digital filtering on the noise reference signal 135 to generate control signal 133. Control signal 133 is an indication of the presence and magnitude of background noise as detected by MMANC functional block 123. Control signal 133 adapts quickly to changing non-stationary noise detected on microphones 109 and 110. In the example of FIG. 4, control signal 133 is changed at the approximate rate that incoming audio samples are received into signal enhancement block 145. Control signal 133 may, for example, change at half the rate of the incoming audio samples 139A and 140A.

Figure 8:
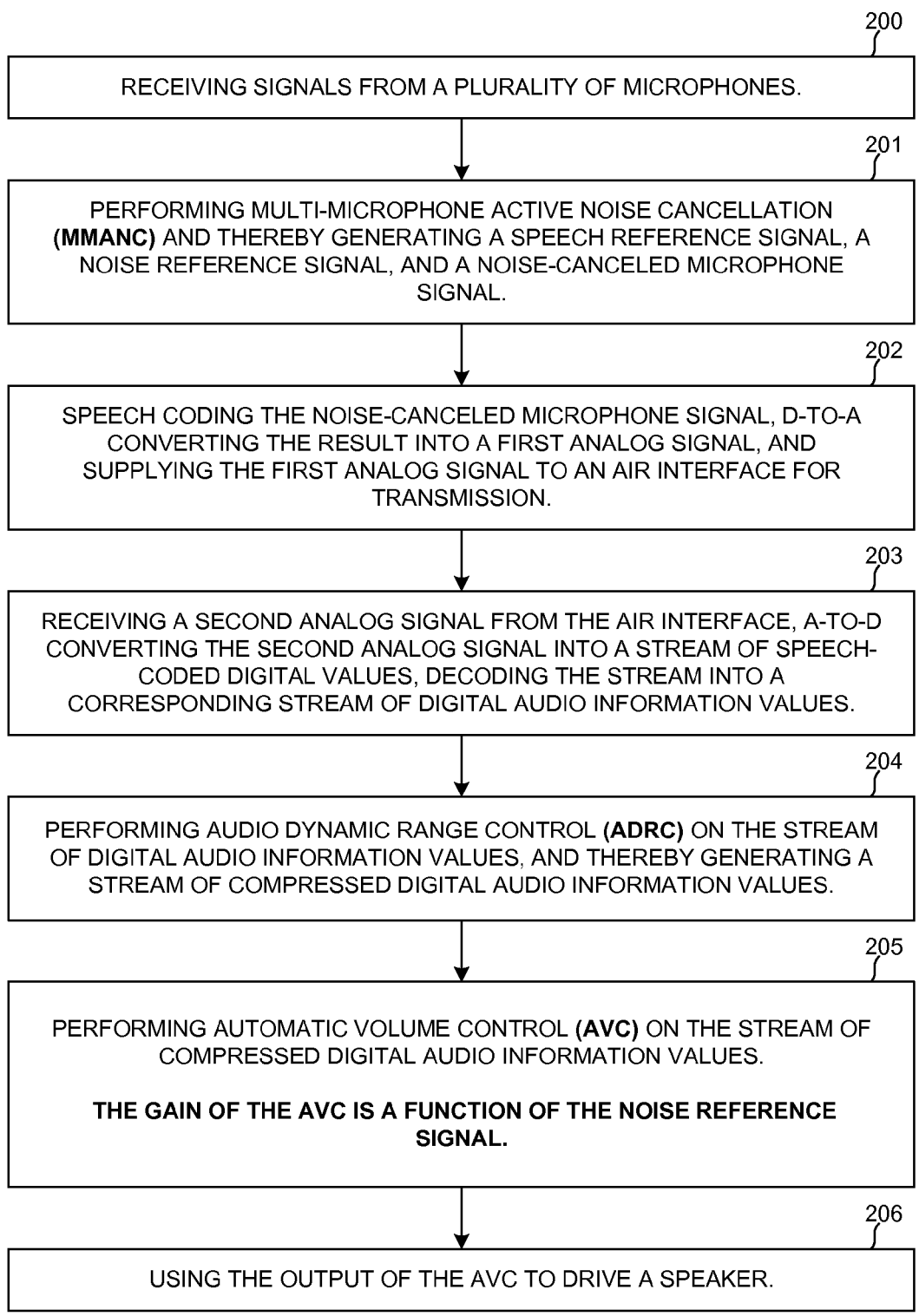
FIG. 8 is a flowchart of a method in accordance with one novel aspect.

FIG. 8 is a flowchart of a novel method carried out by mobile audio device 100 of FIG. 3. Audio signals (streams of digital value samples) are received from microphones 109 and 110 (step 200), and Multi-Microphone Active Noise Cancellation (MMANC) is performed (step 201) on the audio signals, thereby generating a speech reference signal 136, a noise reference signal 135, and a noise-canceled microphone signal 137. The noise-canceled microphone signal 137 is speech-coded (step 202) by an appropriate vocoder in functional block 121, and the result is converted into an analog signal by TX DAC 116. The resulting analog signal is supplied across path 117 to an air interface (for example, a CDMA air interface, a WCDMA air interface, or a GSM air interface) for wireless RF transmission from mobile audio device 100. Steps 200-202 may, for example, be steps carried out by conventional MMANC circuitry employed on a cellular telephone.

A second analog signal is received (step 203) from the air interface, is converted into digital form by RX ADC 112, is decoded by a vocoder in block 121 into a stream of digital audio information values 127. ADRC is performed on the stream 127 (step 204), thereby generating stream 132 of compressed digital audio information values. AVC is performed on stream 132 (step 205). In one novel aspect, the gain applied in the AVC operation is a function of noise reference signal 135. Signal conditioning functional block 124 processes noise reference signal 135, thereby generating control signal 133. Control signal 133 is used to control AVC functional block 126. The output of AVC functional block 126 is optionally volume-adjusted by user volume setting logic 131 (see FIG. 5), is converted into analog form by DAC 120, and is used to drive speaker 108 of FIG. 4. The output of AVC functional block 126 is said to drive speaker 108 indirectly through intervening circuitry as is conventional.

Although certain specific embodiments are described above for instructional purposes, the present invention is not limited thereto. Accordingly, various modifications, adaptations, and combinations of the various features of the described specific embodiments can be practiced without departing from the scope of the invention as set forth in the claims.

What is claimed is:

1. A method comprising:
   (a) performing multi-microphone active noise cancellation (MMANC) and thereby generating an audio reference signal and a noise reference signal;
   (b) performing audio dynamic range control (ADRC) on a stream of digital audio information values and thereby generating a stream of compressed digital audio information values; and
   (c) performing automatic volume control (AVC) on the stream of compressed digital audio information values, wherein a gain of the AVC is a function of the noise reference signal.

2. The method of claim 1, wherein the MMANC of (a), the ADRC of (b) and the AVC of (c) are operations performed by execution of instructions on a processor, and wherein the processor is part of a mobile audio device.

3. The method of claim 1, wherein the method is carried out by a cellular telephone, wherein the MMANC of (a) also results in generation of a noise-canceled microphone signal, wherein the noise-canceled microphone signal is a stream of digital values, the method further comprising:
   performing a vocoder encoding function on the noise-canceled microphone signal.

4. The method of claim 1, wherein the AVC of (c) generates a stream of volume-controlled digital values, the method further comprising:
   converting the stream of volume-controlled digital values into an analog signal; and
   using the analog signal to drive a speaker.

5. The method of claim 1, wherein the ADRC of (b) involves applying a gain to the stream of digital audio information values, wherein the gain is a function of an amplitude of the stream of digital audio information values.

6. The method of claim 5, wherein the function includes a noise gate portion, an expansion portion, a constant gain portion, a compression portion, and a limiter portion.

7. The method of claim 1, wherein steps (a), (b) and (c) are performed on a cellular telephone, and wherein the audio reference signal is a speech reference signal.

8. The method of claim 1, wherein steps (a), (b) and (c) are performed on a digital audio player.

9. The method of claim 1, further comprising:
converting the noise reference signal of (a) into a control value, and wherein the control value at least in part determines the gain of the AVC of (c).

10. The method of claim 1, wherein the gain of the AVC of (c) is a function of both: 1) the noise reference signal, and 2) an amount of available headroom.

11. An integrated circuit comprising:
a multi-microphone active noise cancellation (MMANC) mechanism that receives a first microphone signal and a second microphone signal and that outputs a noise reference signal;
an audio dynamic range control (ADRC) mechanism that receives a first stream of digital audio information values and outputs a second stream of digital audio information values; and
an automatic volume control (AVC) mechanism that amplifies the second stream of digital audio information values by a gain, wherein the gain is adjusted as a function of the noise reference signal.

12. The integrated circuit of claim 11, wherein the MMANC mechanism performs Blind Source Separation (BSS) and generates both the noise reference signal and a speech reference signal, wherein the speech reference signal is relatively free of noise, and wherein the noise reference signal is relatively free of speech.

13. The integrated circuit of claim 11, wherein a relationship of the first stream of digital audio information values to the second stream of digital audio information values is described by a function, wherein the function includes a noise gate portion, an expansion portion, a constant gain portion, a compression portion, and a limiter portion.

14. The integrated circuit of claim 11, wherein the ADRC mechanism is a combination of a first set of instructions and a processor, wherein an execution of the first set of instructions by the processor generates the second stream of digital audio information values.

15. The integrated circuit of claim 14, wherein the AVC mechanism is a combination of a second set of instructions and the processor, wherein an execution of the second set of instructions by the processor amplifies the second stream of digital audio information values by the gain.

16. The integrated circuit of claim 11, wherein the first microphone signal is a stream of digital values that is received onto the MMANC mechanism at a first rate, and wherein the noise reference signal that is output by the MMANC mechanism is adjusted by the MMANC at a second rate that approximates the first rate.

17. An apparatus, comprising:
means for controlling a gain as a function of a noise reference signal, wherein the noise reference signal is generated using multi-microphone active noise cancellation, and wherein the gain is applied to a stream of digital audio information values; and
an audio dynamic range control mechanism that generates the stream of digital audio information values.

18. The apparatus of claim 17, wherein the audio dynamic range control mechanism is a combination of a processor and a set of instructions stored in a processor-readable memory, wherein an execution of the set of instructions by the processor generates the stream of digital audio information values.

19. The apparatus of claim 17, further comprising:
means for performing said multi-microphone active noise cancellation and thereby generating the noise reference signal.

20. The apparatus of claim 17, further comprising:
means for performing Blind Source Separation (BSS) and thereby generating the noise reference signal.

21. The apparatus of claim 17, wherein the apparatus is a single integrated circuit disposed in a mobile device, wherein the mobile device is taken from the group consisting of: a digital media player, a digital audio player, an MP3 player, a personal digital assistant, a laptop computer, a portable computer, a mobile communication device, and a cellular telephone.

* * * * *